United States Patent [19]

Emanuel

[11] Patent Number: 5,231,755
[45] Date of Patent: Aug. 3, 1993

[54] METHOD OF FORMING SOLUBLE ALIGNMENT BARS

[75] Inventor: Norbert T. Emanuel, Los Altos, Calif.

[73] Assignee: Emanuel Technology, Inc., Sunnyvale, Calif.

[21] Appl. No.: 998,546

[22] Filed: Dec. 30, 1992

Related U.S. Application Data

[63] Continuation-in-part of Ser. No. 747,733, Aug. 20, 1991, Pat. No. 5,177,591.

[51] Int. Cl.$^5$ ............................................. H01R 43/00
[52] U.S. Cl. ..................................................... 29/827
[58] Field of Search ................. 29/827; 437/206, 209; 174/52.4; 257/674, 666

[56] References Cited

U.S. PATENT DOCUMENTS

| | | | |
|---|---|---|---|
| 4,132,856 | 1/1979 | Hutchison et al. | 174/52 PE |
| 4,204,317 | 5/1980 | Winn | 29/827 |
| 4,466,183 | 8/1984 | Burns | 29/827 |
| 4,721,994 | 1/1988 | Mine et al. | 357/70 |
| 4,728,568 | 3/1988 | Sasada et al. | 428/349 |
| 4,754,317 | 6/1988 | Comstock et al. | 357/70 |
| 4,774,635 | 9/1988 | Greenberg et al. | 361/421 |
| 4,796,080 | 1/1989 | Phy | 357/70 |
| 4,801,561 | 1/1989 | Sankhagowit | 437/207 |
| 4,801,997 | 1/1989 | Ono et al. | 357/70 |
| 4,809,135 | 2/1989 | Yerman | 361/404 |
| 4,859,808 | 8/1989 | Jeter et al. | 174/68.5 |
| 4,899,207 | 2/1990 | Hallowell et al. | 357/70 |
| 4,987,475 | 1/1991 | Schlesinger et al. | 357/70 |
| 5,085,362 | 2/1992 | Art et al. | 29/827 |

FOREIGN PATENT DOCUMENTS

| | | | |
|---|---|---|---|
| 0073547 | 4/1988 | Japan | 357/70 |
| 0097051 | 4/1988 | Japan | 357/70 |
| 0076745 | 3/1989 | Japan | 357/70 |
| 0090558 | 3/1990 | Japan | 357/70 |

*Primary Examiner*—Irene Cuda
*Attorney, Agent, or Firm*—Schneck & McHugh

[57] ABSTRACT

A method of fabricating a lead frame inner connection assembly includes forming a lead frame having conductive fingers with inner lead ends connected to an electronic component, such as an integrated circuit die. Fluid-soluble alignment bars are deposited and cured within the areas between the conductive fingers. Preferably, the alignment bars are water soluble and are deposited using silk screen techniques. In a subsequent step of encapsulating the electronic component and inner lead ends, the alignment bars function as dams to prevent the flow of material beyond the desired extent of the encapsulation. At the ends of the alignment bars opposite to the electronic component a molded carrier ring may be formed, with the alignment bars again acting as dams to limit the flow of material. Conductive material can be contained within fluid-soluble material, thereby providing some degree of electrical connection between adjacent conductive fingers via the alignment bars.

17 Claims, 2 Drawing Sheets

METHOD OF FORMING SOLUBLE ALIGNMENT BARS

CROSS REFERENCE TO RELATED PATENT

This is a continuation in part application of U.S. Pat. No. 5,177,591 to Emanuel, issued Jan. 5, 1993.

TECHNICAL FIELD

The present invention relates generally to lead frame assemblies and more particularly to methods of forming alignment bars for encapsulating electronic components.

BACKGROUND ART

Integrated circuit dies include contact pads, or input/output pads, along edges of the dies to allow electrical communication between circuitry within the dies and outside circuitry. Lead frames have a plurality of conductive fingers attached to the contact pads either directly or by means of other conductors such as bond wires. A die and the inner lead ends of the conductive fingers are typically encapsulated within ceramic or other dielectric material. Mechanical and electrical connection to outside circuitry is made at portions of the conductive fingers outside of the encapsulation. For example, the outer lead ends may be soldered to a printed circuit board or the like.

Alignment bars are utilized to link adjacent conductive fingers during the fabrication and attachment steps. The most commonly known alignment bars are tie bars and dam bars. As described in U.S. Pat. No. 4,987,475 to Schlesinger et al., dam bars interconnect the conductive fingers in the plane of the lead frame and act as dams which limit the flow of material during transfer molding of the encapsulation. Schlesinger et al. describe one molding process as joining two mold halves together with the conductive fingers projecting through an opening between the halves, thereby leaving gaps between the conductive fingers and the mold halves through which the encapsulation material can extrude during molding. The dam bars prevent any significant flow of material. Tie bars connect the conductive fingers at the outer lead ends. During the molding process, the tie bars serve to maintain the proper alignment and spacing of the leads.

Dam bars and tie bars are typically made of the same material as the conductive fingers, e.g., copper. The lead frame is fabricated so that the bars and the conductive fingers are a unitary structure. The bars electrically short the conductive fingers together Thus, the bars must be removed after the intended function has been fulfilled. Following encapsulation of the integrated circuit die, the dam bars are removed by a punching operation. Tie bars are removed by cutting or shearing the bars from the conductive fingers.

The punching operation for removing bars presents a number of difficulties. With the ever-present goal of miniaturizing electronic components, integrated circuit dies are decreasing in size and increasing in the number of contact pads. Consequently, the density of conductive fingers is increasing. The punching operation of bars imposes a manufacturing limit on density. Reliably punching each portion of a dam bar from between adjacent fingers becomes more difficult as density increases. Schlesinger et al. describe the difficulties of removing tie bars as the potential of leaving "pigtails" of metal and as adding handling steps.

Other alignment bars are known. Schlesinger et al. teach use of a web bar that is integral with the conductive fingers and that provides enhanced lead alignment when the conductive fingers are brazed to pads of fine line ceramic integrated circuit packages. After brazing, the web bar is mechanically removed using a punch trim tool. Tooling holes in the lead frame provide alignment for the punch trim tool, thereby increasing the accuracy and reliability of bar removal U.S. Pat. No. 4,796,080 to Phy teaches use of intermediate bars located between tie bars and dam bars. The intermediate bars are made of a semiconductor material to guard against damage caused by electrostatic discharge during handling, but to provide sufficient electrical isolation of conductive fingers to allow testing prior to removal of the intermediate bars. The dam bars and tie bars are removed using conventional steps, whereafter the alignment and separation of fingers is maintained by the semiconductor intermediate bars. Removal of the intermediate bars is facilitated by scoring, or by localized stressing or weakening, the conductive fingers. U.S. Pat. No. 4,801,561 to Sankhagowit teaches use of cross-links that function as dam bars to prevent ejection of encapsulent from the molding process between the conductive fingers. The cross-links are integral with the conductive fingers and are removed in a manner described above.

It is an object of the present invention to provide a method of fabricating a lead frame inner connection assembly having alignment bars which allow removal without imposing manufacturing limits on the density of leads of a lead frame.

SUMMARY OF THE INVENTION

The above object has been met by fabricating a lead frame to include alignment bars that can be removed without special tooling and without the potential of reducing the structural integrity of conductive fingers on the lead frame. Moreover, the alignment bars are limited to positions in which the alignment bars do not interfere with an encapsulating step that follows. The alignment bars are soluble members that are dissolved after the bars have served their intended purpose.

An electronic component, typically an integrated circuit die, is attached to inner lead ends of the lead frame. Either prior or subsequent to attachment to the electronic component, a fluid-soluble solution, typically a paste which can be applied by silk screen techniques, is applied to the areas between the conductive fingers of the lead frame. The application of the fluid-soluble solution is performed in a manner to maintain the opposed major surfaces of the conductive fingers substantially free of the solution For example, the lead frame may be placed on a support surface and the major surface of the conductive fingers that is opposite to the support surface may be masked, such as by a stencil.

The fluid-soluble paste is then cured to provide fixed alignment bars. After the paste has hardened, the electronic component is encapsulated using standard techniques. The alignment bars prevent the encapsulating material from migrating beyond the desired extent of the encapsulating package. However, because the major surfaces of the conductive fingers are substantially free of the fluid-soluble material, the encapsulating step does not exert a pressure on foreign matter, i.e., the fluid-soluble material, on the conductive fingers.

Because pressure on foreign matter might cause some deforming of the conductive fingers, maintaining the opposed major surfaces substantially free of the cured fluid-soluble material improves the reliability of the lead frame assembly.

The fluid-soluble material is then dissolved by applying a solvent. While using a material which dissolves in a gas is contemplated, preferably the material is of a type that dissolves by the application of a liquid. In a most preferred embodiment, the alignment bars are water soluble. The support surface that is optionally used during the step of depositing the fluid-soluble solution may be a fluid-soluble tape that is adhesively secured to the bottom surface of the conductive fingers.

An advantage of the present invention is that removal of the fluid-soluble alignment bars does not require a punch tool that would have to be precisely aligned so as not to adversely affect the structural integrity of the conductive fingers. Rather, removal requires only the application of a solvent. Another advantage is that the density of the conductive fingers can be increased, since there is no requirement of punching alignment bars from between adjacent conductive fingers.

The alignment bars can extend longitudinally along the gaps between adjacent fingers. The inner ends of the alignment bars are positioned at the area of the encapsulating package to be formed. Optionally, the molding process of the encapsulation may include forming a molded carrier ring at the outer ends of the alignment bars. In this embodiment, the alignment bars act as dams at both the inner and the outer ends.

BEST MODE FOR CARRYING OUT THE INVENTION

Figure 1:
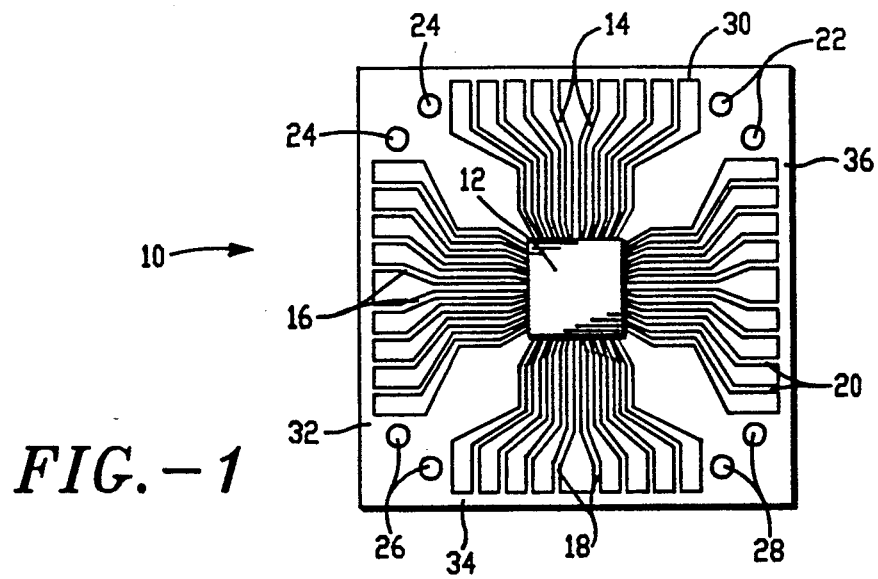
FIG. 1 is a top view of a lead frame having an integrated circuit die at a central region in accordance with the present invention.

With reference to FIG. 1, a lead frame 10 is shown as being connected to an integrated circuit die 12. The lead frame can also be connected to other electronic components, such as a multi-chip module.

The lead frame 10 is constructed from a thin layer of electrically conductive material For example, a copper layer having a thickness of 0.003 inch may be used. The layer is then chemically etched to form a pattern of conductive fingers 14, 16, 18 and 20. Standard photolithographic techniques are used in etching material to provide the desired pattern. While a stamping process may be used to form the conductive fingers, the chemical etching process is preferred because it allows a greater density of fingers.

Alignment holes 22, 24, 26 and 28 are also etched into the copper layer. The alignment holes facilitate proper orientation of the lead frame 10 during assembly and testing.

The conductive fingers 14-20 have outer lead ends that are mechanically and electrically connected by tie bars 30, 32, 34 and 36. The tie bars fix the thin conductive fingers 14-20 in position, so that the fingers are less susceptible to damage during handling. The tie bars must be removed prior to testing or operation of the integrated circuit die 12. Serrations may be etched into the tie bar regions for easy removal of the tie bars.

Figure 2:
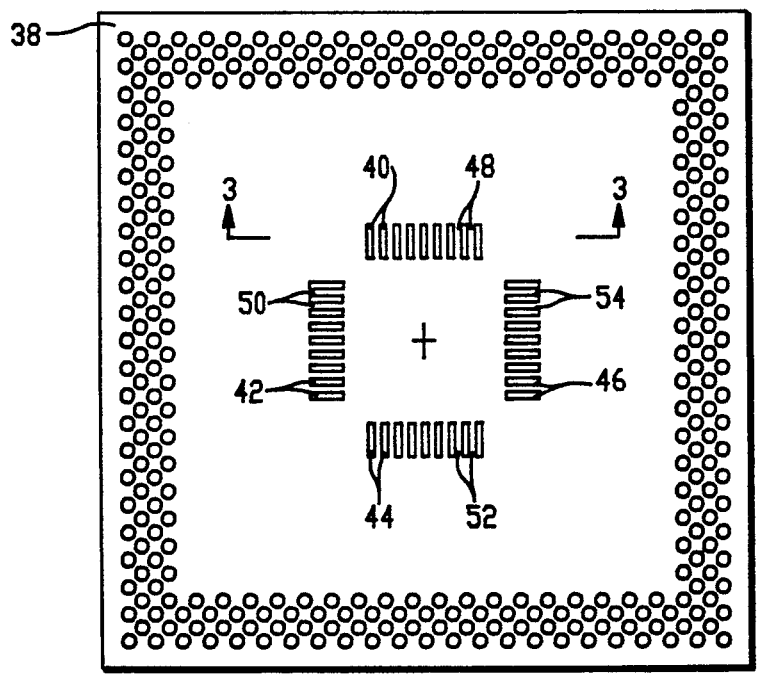
FIG. 2 is a top view of a silk screen stencil having slots arranged for alignment with spacings between conductive fingers of the lead frame of FIG. 1.
Figure 3:
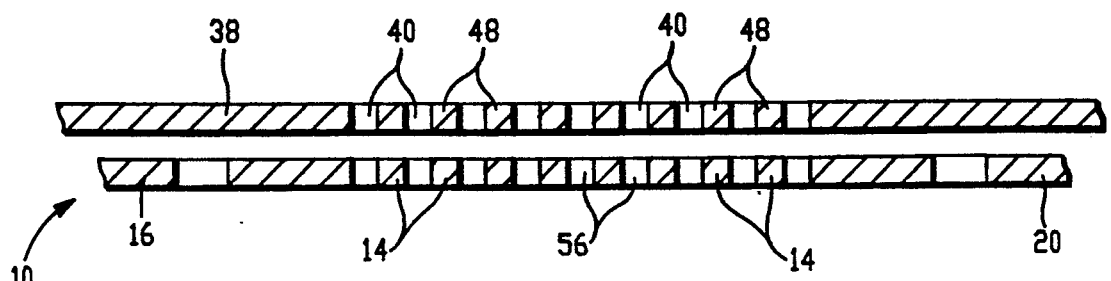
FIG. 3 is a side sectional view of the stencil of FIG. 2 taken along lines 3—3, with the stencil being aligned with the lead frame of FIG. 1.

Referring now to FIG. 2, a stencil 38 is shown as including arrays of slots 40, 42, 44 and 46. The stencil is of the type conventionally employed in silk screening material onto a planar surface. However, in use with the present invention, the stencil 38 is aligned with spaces between the conductive fingers 14-20 of FIG. 1. That is, lands 48, 50, 52 and 54 between the slots 40-46 on the stencil are positioned directly over the conductive fingers. This alignment is shown in FIG. 3. The lands 48 of the stencil 38 have dimensions generally equal to those of the conductive fingers 14, so that slots 40 of the stencil correspond with the spacings 56 between the conductive fingers 14.

Figure 4:
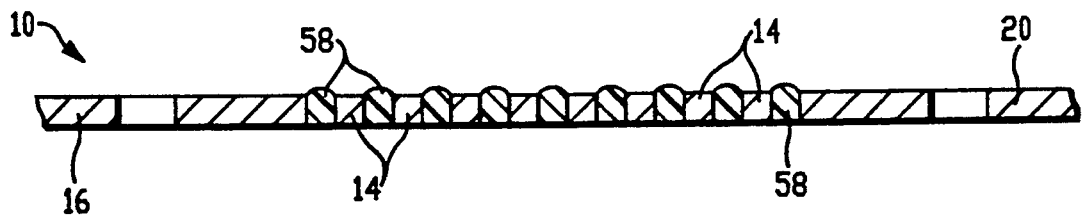
FIG. 4 is a side sectional view of the lead frame of FIG. 3 having fluid-soluble material selectively deposited within spacings between adjacent conductive fingers.

A fluid-soluble solution is then silk screened into the spacings 56 between the conductive fingers 14. As shown in FIG. 4, the fluid-soluble solution 58 is masked from being deposited onto the upper surfaces of the conductive fingers 14. By maintaining the fingers substantially free of the fluid-soluble material, the fingers are less susceptible to being bent during the subsequent step of encapsulating the inner lead ends of the conductive fingers.

The fluid-soluble material is typically a paste, but this is not critical. An acceptable paste is sold by Tech Spray under the trademark WONDERMASK WS 2207. Preferably, the paste is mixed with a clay material to achieve the desired viscosity, thereby reducing the tendency of the paste to run. A conductive filler is optionally added, so that the alignment bars may be used to guard against damage resulting from an electrostatic discharge. That is, the conductive filler acts to provide some electrical continuity between adjacent fingers 14-20 after removal of the tie bars at the outer lead ends.

While the solution is preferably water soluble, this is not critical. Materials which dissolve in other liquids or in a gas may be used. In this connection, the term "fluid soluble" is defined as "rapid dispersion in a solvent fluid."

As described above, the lands 48-54 of the stencil 38 of FIG. 3 match the upper surfaces of the conductive fingers 14. The lower surfaces are protected by a support surface on which the lead frame 10 rests. The solution 58 of FIG. 4 is then cured to harden the material and form fixed alignment bars. The lead frame 10 is then removed from the support surface. The support surface should be made of a material that does not adhere to the alignment bars, so that removing the lead frame from the support surface does not disturb the alignment bars.

Figure 5:
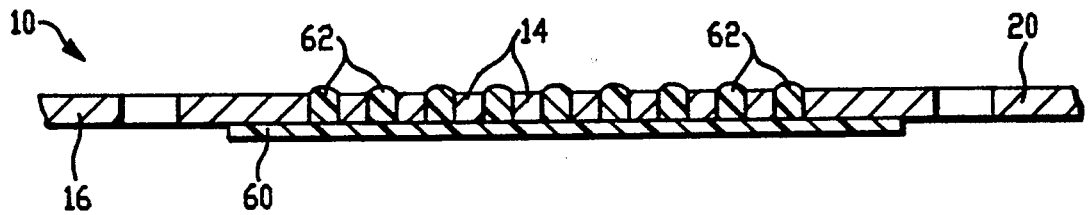
FIG. 5 is a side sectional view of a second embodiment of a lead frame having fluid-soluble alignment bars.

As an alternative to placing the lead frame 10 on a fixed support surface, a fluid-soluble tape 60 may be adhered to the bottom of the lead frame 10, as shown in FIG. 5. The solution is then deposited within the spacings between adjacent conductive fingers 14, whereafter the solution is hardened to provide the fixed alignment bars 62. An acceptable tape having a solubility of 100 in water is sold by Tech Spray in Amarillo, Tex. The embodiment of FIG. 4 is the preferred embodiment, since the absence of the tape 60 provides a lead frame that is less susceptible to deforming by the flow of encapsulating material. Moreover, pastes are typically more soluble in a solvent fluid. For example, the paste identified above has a solubility of 40 in water, while the tape 60 has a solubility of 100. On the other hand, by using the tape 60 as the support surface, the alignment bars are less likely to separate from the areas between the conductive fingers 14.

Figure 6:
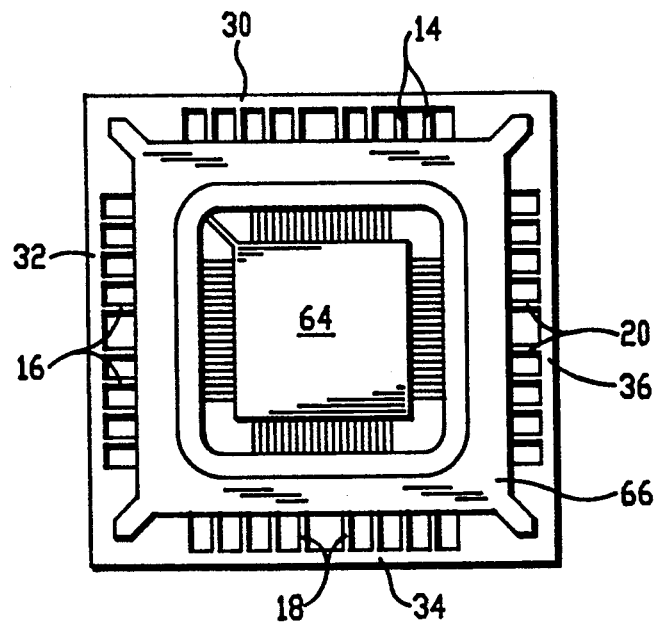
FIG. 6 is a top view of the lead frame of FIG. 1 having encapsulating material formed thereon.

Referring now to FIG. 6, encapsulate material is then applied using conventional transfer molding techniques to enclose the integrated circuit die and the inner lead ends of the conductive fingers 14–20 within a package 64. Ceramics and other dielectric materials are employed in forming the package. The same process is used to form a molded carrier ring 66 close to the other lead ends of the conductive fingers. The tie bars 30–36 can then be removed to electrically isolate the conductive fingers for testing, with the molded carrier ring securely supporting the thin fingers in position.

The inner ends of the fluid-soluble alignment bars function as barriers to prevent the migration of encapsulate material beyond the desired extent of the package 64. At the outer ends of the alignment bars, the fluid-soluble material stops any inward flow of encapsulate material during formation of the molded carrier ring 66.

The assembly of FIG. 6 is then subjected to the solvent for removing the alignment bars. For the materials identified above, the assembly is soaked in heated water to dissolve the alignment bars. A brushing action or a pressurized spray may be used to wash the water-soluble material from between the conductive fingers 14–20.

While the fluid-soluble bars have been explained and illustrated as used with dam bars, other embodiments are possible. For example, the tie bars may also be fluid soluble. Moreover, in addition to silk screening, other techniques may be used to form the alignment bars between the conductive fingers, providing that the upper surface is protected from receiving any significant amount of the fluid-soluble material.

I claim:

1. A method of fabricating a lead frame interconnection assembly comprising,
   forming a pattern of spaced apart conductive fingers such that the conductive fingers have inner lead ends for attachment to an electronic component and have outer lead ends,
   depositing a solution of fluid-soluble material between the conductive fingers such that opposed surfaces of the conductive fingers remain substantially free of the solution of fluid-soluble material, the depositing of the solution of fluid-soluble material being outward of the inner lead ends,
   hardening the solution of fluid-soluble material between the conductive fingers, thereby forming alignment bars for confining spread of encapsulating material to be formed at the inner lead ends, and
   applying a fluid to the conductive fingers and fluid-soluble material such that the fluid-soluble material is removed without affecting the structural integrity of the conductive fingers.

2. The method of claim 1 wherein the depositing of the fluid-soluble material is a step using silk screening techniques.

3. The method of claim 1 comprising attaching the inner lead ends of the conductive fingers to an integrated circuit die.

4. The method of claim 3 further comprising transfer molding encapsulating material to house the integrated circuit die and the inner lead ends.

5. The method of claim 1 wherein the alignment bars have inner ends and outer ends, the method further comprising forming an encapsulating structure at the inner ends and forming a molded carrier ring at the outer ends of the alignment bars.

6. The method of claim 1 further comprising fixing a fluid-soluble tape to first surfaces of the conductive fingers, the depositing of the solution of fluid-soluble material being a step of masking second surfaces of the conductive fingers and applying the solution of fluid-soluble material between the conductive fingers such that the first and second surfaces remain substantially free of the solution.

7. The method of claim 1 further comprising forming the solution of fluid-soluble material to include conductive material, thereby providing alignment bars that electrically connect adjacent conductive fingers.

8. A method of fabricating a lead frame inner connection assembly comprising,
   forming a pattern of spaced-apart conductive fingers having inner lead ends and outer lead ends, the conductive fingers having opposed first and second surfaces,
   electrically connecting the inner lead ends to input/output pads of an integrated circuit die,
   masking the first surface of the conductive fingers, while leaving the areas between the conductive fingers exposed,
   depositing a water-soluble material between the conductive fingers, the masking of the first surface substantially preventing the water-soluble material from reaching the first surface,
   curing the water-soluble material between the conductive fingers, thereby forming fixed alignment bars, and
   encapsulating the integrated circuit die, the fixed alignment bars acting to stop the flow of encapsulating material between the conductive fingers.

9. The method of claim 8 wherein forming the pattern of conductive fingers is a step of forming a lead frame having four arrays of leads, the depositing and curing of the water-soluble material forming fixed alignment bars having inner and outer leads.

10. The method of claim 9 wherein encapsulating the integrated circuit die includes forming a molded carrier ring at the outer ends of the fixed alignment bars.

11. The method of claim 8 further comprising washing away the fixed alignment bars after encapsulating the integrated circuit die.

12. The method of claim 8 wherein depositing the water-soluble material is a step of depositing an electrically conductive paste.

13. A method of fabricating a lead frame inner connection assembly comprising,
   forming a lead frame having conductive fingers,
   attaching an electronic component to inner lead ends of the conductive fingers,
   locating a flat surface along a first side of the conductive fingers,
   silk screening a fluid-soluble paste between the conductive fingers such that the flat surface maintains the fluid-soluble paste in position therebetween, curing the fluid-soluble paste, thereby forming fluid-soluble alignment bars, encapsulating the electronic component, and dissolving the fluid-soluble alignment bars.

14. The method of claim 13 wherein silk screening the fluid-soluble paste is a step that includes aligning a stencil atop the conductive fingers on the side opposite to the flat surface, the stencil having longitudinal openings corresponding to spacing between the conductive fingers.

15. The method of claim 13 wherein encapsulating the electronic component is a step using transfer molding techniques.

16. The method of claim 15 wherein the step of encapsulating the electronic component further includes forming a molded carrier ring on a side of the fluid-soluble alignment bars that is opposite to the electronic component.

17. The method of claim 13 wherein locating a flat surface along a first side of the conductive fingers is a step of attaching fluid-soluble tape to the first side.

* * * * *